(12) United States Patent
Forcier

(10) Patent No.: US 7,011,988 B2
(45) Date of Patent: Mar. 14, 2006

(54) BUILD-UP STRUCTURES WITH MULTI-ANGLE VIAS FOR CHIP TO CHIP INTERCONNECTS AND OPTICAL BUSSING

(75) Inventor: Robert Forcier, Mesa, AZ (US)

(73) Assignee: FlipChip International, LLC, Phoenix, AZ (US)

( * ) Notice: Subject to any disclaimer, the term of this patent is extended or adjusted under 35 U.S.C. 154(b) by 0 days.

(21) Appl. No.: 11/145,948

(22) Filed: Jun. 7, 2005

(65) Prior Publication Data

US 2005/0269687 A1     Dec. 8, 2005

Related U.S. Application Data

(63) Continuation of application No. 10/704,131, filed on Nov. 10, 2003, now Pat. No. 6,919,508.

(60) Provisional application No. 60/424,710, filed on Nov. 11, 2002.

(51) Int. Cl.
*H01L 21/44*         (2006.01)

(52) U.S. Cl. ................ 438/108; 438/118; 438/121; 438/122; 438/125

(58) Field of Classification Search ........... 438/108, 438/110, 118, 121, 122, 125
See application file for complete search history.

(56) References Cited

U.S. PATENT DOCUMENTS

| | | | | |
|---|---|---|---|---|
| 5,843,808 | A | * 12/1998 | Karnezos | .............. 438/121 |
| 5,999,415 | A | * 12/1999 | Hamzehdoost | .......... 361/803 |
| 6,518,090 | B1 | 2/2003 | Dotta et al. | ............ 438/106 |
| 6,544,812 | B1 | * 4/2003 | Camenforte et al. | ........ 438/106 |
| 6,566,166 | B1 | * 5/2003 | Chien | .................. 438/108 |
| 6,569,712 | B1 | * 5/2003 | Ho et al. | ................. 438/121 |
| 6,632,028 | B1 | 10/2003 | Yant et al. | ............... 385/88 |
| 6,657,124 | B1 | 12/2003 | Ho | ...................... 174/52.4 |
| 6,753,208 | B1 | 6/2004 | MacIntyre | ............... 438/118 |
| 6,781,244 | B1 | 8/2004 | Prabhu | ................ 257/778 |

* cited by examiner

*Primary Examiner*—Hung V. Ngo
(74) *Attorney, Agent, or Firm*—Greenberg Traurig, LLP; James E. Goepel, Esq.; Bruce T. Neel, Esq.

(57) ABSTRACT

A build-up structure for chip to chip interconnects and System-In-Package utilizing multi-angle vias for electrical and optical routing or bussing of electronic information and controlled CTE dielectrics including mesocomposites to achieve optimum electrical and optical performance of monolithic structures. Die, multiple die, Microelectromechanical Machines (MEMs) and/or other active or passive components such as transducers or capacitors can be accurately positioned on a substrate such as a copper heatsink and multi-angle stud bumps can be placed on the active sites of the components. A first dielectric layer is preferably placed on the components, thereby embedding the components in the structure. Through various processes of photolithography, laser machining, soft lithography or anisotropic conductive film bonding, escape routing and circuitry is formed on the first metal layer. Additional dielectric layers and metal circuitry are formed utilizing multi-angle vias to form escape routing from tight pitch bond pads on the die to other active and passive components. Multi-angle vias can carry electrical or optical information in the form of digital or analog electromagnetic current, or in the form of visible or non-visible optical bussing and interconnections.

18 Claims, 13 Drawing Sheets

BUILD-UP STRUCTURES WITH MULTI-ANGLE VIAS FOR CHIP TO CHIP INTERCONNECTS AND OPTICAL BUSSING

PRIORITY CLAIM

This application is a continuation of and claims priority from U.S. patent application Ser. No. 10/704,131 filed on Nov. 10, 2003 now U.S. Pat. No. 6,919,508, which in turn claims the benefit of U.S. Provisional application Ser. No. 60/424,710 filed Nov. 11, 2002. The teachings of these related patent applications are hereby incorporated by reference in their entirety.

FIELD OF THE INVENTION

The present invention relates to the field of high density and high speed semiconductor packages and optical interconnects. In particular, the present invention provides build-up structures for interconnecting single or multiple semiconductor chips, Microelectromechanical Machines (MEMs) and/or die thereof of various thicknesses embedded in multilayer structures, a System-In-Package, Wafer-Scale Packages, or metal clad laminates utilizing multi-angle optical and/or electrical vias and controlled CTE dielectrics such as mesocomposites, to achieve electrical and optical performance.

BACKGROUND OF THE INVENTION

In the manufacturing of chip packaging, attempts have been made to maintain efficient interconnection between the die and other components as die and pad densities increase at a dramatic rate and geometries decrease at an equally dramatic rate. The technology roadmap for semiconductor packaging has technical drivers which describe meticulous efforts to bring the die closer to other components through thinner and denser chip packaging to achieve higher finished system functionality. In one such effort, a semiconductor package is sometimes eliminated and the die are placed directly on the printed circuit in a flip-chip process which often uses die that have been prepared for placement through a process known as "Chip Scale Packaging" or CSP.

Chip Scale Packaging involves preparing a semiconductor die with appropriate dielectrics and conductive bumps on the active site of the die so that the die is properly prepared to attach to another interconnect such as a printed circuit board. FIG. 1 a cut-away view of a prior art process through which an individual die undergoes bumping and dielectric coating, wherein the assembly is subsequently bonded to a substrate and the conductive bumps break through an adhesive to make electrical contact to the substrate, thereby completing a chip package. This preparation does not typically extend the physical dimensions of the die in length or width, which has given rise to the term "Chip Scale" for such a preparation.

In an effort to keep up with Moore's Law in Semiconductors, which predicts higher interconnection densities over time, a lot of focus has been spent on Chip Scale Packages to achieve thinner, denser packages and escape routing. Escape routing is the process of interconnecting close proximity die bond pads with mating bond pads in the chip package or the printed circuit board on the applied dielectrics of the CSP. The pitch on the die maybe at 75 microns and the closest pitch obtainable on the printed circuit may be 250 microns. The work of providing escape routing through circuitry on the Chip Scale package becomes difficult as geometries keep shrinking. Chip Scale Packaging has evolved the technologies of Build-up and Redistribution to assist in this escape routing.

Build-up processes and Redistribution technology places dielectrics external to the active wafer or die surface for the Chip Scale Package, usually through a spin coating process in the wafer fab, followed by formation of holes in the dielectric usually through a photoimaging process. The wafer and dielectric then proceeds through a metallic sputtering process to apply a conductor to achieve interconnect vias through the holes in the dielectric and conductive material on the surface. The surface metal is then chemically milled to a circuitry pattern utilizing another photoimaging process thereby completing the external circuitry for a first metal layer on the wafer or die for the Chip Scale Package. After this process the wafer is sawed to release the Chip Scale Package which includes a singulated die.

The state-of-the art in Chip Scale Packaging is the use of multiple layers of metallization and multiple layers of the dielectric to achieve the highest density microelectronic package. This forms a multilayer interconnect and this multilayer process is called Build-up because each dielectric is added sequentially. For formation of more than one metal layer, the process of spinning on a dielectric, forming via holes, metallization and photoimaging is repeated. The Build-up process is commonly utilized in the printed circuit and chip packaging manufacturing arenas for multilayer interconnects and is now being used in very dense packages where the Build-up process begins on the surface of the active silicon. These interconnects and packages are sometimes referred to as Wafer Scale Packaging (WSP). FIG. 2 is a cut-away view of a prior art process through which a multilayer package is prebuilt without a die, wherein an access port is etched in the substrate revealing the connections for the die, the die is placed in the access port, and the structure is bonded together. FIG. 3 is a cut-away view of a prior art process through which a die is positioned and bonded in an access port of a substrate, wherein the dielectric layers and via interconnects are built on top of this structure.

Another multiple die version of Chip Scale Packaging is sometimes referred to as build-up on die or System-In-Package (SIP). Intel Corporation developed a version of build-up on die referred to as BBUL. FIG. 4 is a cut-away view of a prior art build-up on die process utilizing a carrier tape to position the die, wherein the carrier tape is subsequently removed and copper/dielectrics are deposited to form individual layers in a process similar to the Intel Corporation BBUL process. This technology is an extension of Chip Scale Packaging and first locates multiple die on an adhesive tape or similar substrate and molds an encapsulant to secure the die in place. After removing the adhesive tape, a series of dielectrics and conductive layers are built upon these initial die thereby forming the chip to chip interconnect structure. There are benefits to the build-up on die process over typical chip packaging because of the close proximity that is possible with the die and the interconnections. This closer proximity provides improved electrical performance due to lower inductance of the vias and improved signal integrity because signals from die to die travel a shorter distance.

Complex build-up on die processing suffers from technological constraints due to reliability and quality issues when temperature excursions (as in soldering) cause fractures in the composite which are due to Coefficient of Thermal Expansion (CTE) differences between the various materials and components of the package. These issues are even more problematic when attempts are made to package multiple die of different geometries and materials in a monolithic structure. For example, encapsulation materials of the embedded die and the design of the vias often result in an undesirably rigid structure which, combined with the CTE mismatch materials, causes delamination (adhesion failure) during a thermal stress or soldering operation. Furthermore, the embedding of various components, such as sensors, MEMs (Micro Electromechnaical Machines), capacitors, resistors, inductors, transducers and antennas, each of which typically has a unique CTE, cannot be performed in multicomponent structures due to additional stress issues of the various materials and their different CTE values.

Another shortcoming of existing art is that it does not accommodate various component thicknesses during a multilayer structure embedding process because the build-up process requires a very level surface for the first dielectric and metal layers to be successful. Various die thicknesses would be typical in a high speed system because more than one material is used for the wafer processing. High Speed systems may have multiple die fabricated with two different materials such as Gallium Arsenide (GAAS) and Silicon Germanium (SiGe). Each of these die substrate materials would have with their respective thickness profiles and the thickness difference's would not be suitable for existing build-up on die processes.

Still another shortcoming of build-up on die prior art is that it does not facilitate die electrical testing prior to embedding. Semiconductor wafer processing techniques are known to have defects that are undetectable unless tested, and testing often occurs after the die is packaged. In a build-up on die process, if a die is defective, the entire monolithic structure will be wasted because testing cannot be performed very early in the process. Only known good die (KGD) can be used with prior art build-up on die processes.

Build-up on Die and Chip Scale packaging do not accommodate optical transmission of data between chips in either discrete component technologies or in monolithic technologies. As digital broadband increases its bandwidth and microprocessor speeds increase, there are technology drivers to utilize optical waveguides, embedded optical components and solid state monolithic structures for die-to-die, or die-to-component interconnect structures. The bandwidth limit for copper transmission of digital signals, for example, is between 600 Megabits/second and 10 Gigabits/second depending on the circuit design and the absorbance of the dielectric materials. Optical signal transmission can increase available bandwidth to several times copper wire bandwidth. Existing build-up on die techniques do not accommodate the direct connection of optical components for die-to-die or component-to-component optical interconnections to tap into these higher bandwidths.

Build-up on die and Chip Scale packaging also have difficulty addressing thermal dissipation requirements of monolithic structures. Multiple die are typically placed in closer proximity to leverage the performance gains associated with such placement. However, as performance increases, the die dissipate more heat energy during operation, and consequently a means of dissipating the heat to an external cooling source either passively by conduction or with an active system becomes more critical. Existing build-up on die and CSP technologies have difficulty in removing excess heat during operation of the system.

Typically, build-up on die and chip scale packaging utilize copper vias with various configurations such as plated-through-holes, blind vias, buried vias, or microvias for interconnecting the die and the copper circuitry in a package. These vias connect one circuitry layer (sometimes referred to as metal layer) to the next. These vias are usually formed 90 degrees to the plane of the circuitry, die, or dielectrics.

Although commonly used, sharp, 90 degree structures have several disadvantages when utilized unilaterally throughout a structure in high speed, high density designs. Both electrical signals and optical signals experience significant signal loss at a 90 degree bend. Electrical signals radiate significant amounts of energy and noise at the 90 degree bend thereby degrading the signal. Optical signals experience a more difficult hurdle because a relatively large percentage of the incoming optical light is reflected back to the source, never making the bend. Also, 90 degree angles are sometimes not the optimum escape design routing from the very tight pitch on the die to wider pitched components on other components. For example, a die could have a 75 micron pitch or distance between bonding pads. A printed circuit board may have a 250 micron pitch. A typical design may take three circuitry layers and three dielectric layers to connect these bond sites utilizing 90 degree vias. As the mismatch between the pitch of the die and the component increases, the likelihood of requiring more circuitry layers increases with 90 degree vias, thereby increasing the cost of the system. In addition, 90 degree vias exhibit high degrees of stress between the via and the copper circuitry during a thermal excursion due to the CTE mismatch of copper circuitry and the dielectric materials. Cracks often initiate at the interface between the via and copper circuitry which can result in a circuitry failure and an electrical open circuit.

SUMMARY OF THE INVENTION

Accordingly, the present invention is directed to providing chip to chip optical and electrical interconnection by embedding semiconductor die and other active and passive components in a multilayer interconnect structure such as Microelectromechanical Machines (MEMs) and MEMs Sensors that substantially obviates one or more of the problems due to limitations and disadvantages of the prior art.

An object of the present invention is to develop a means by which entire electronic systems, preferably with multiple active and passive components, can be packaged into one multilayer structure thereby achieving improved performance at high speeds including excellent electrical, mechanical, thermal, cost, and reliability characteristics.

Another object of the present invention is to create optical busses or interconnects between adjacent die to achieve a multi-fold improvement in bandwidth for electronic signals in applications such as microprocessor to memory cache bussing, microprocessor to microprocessor data exchange for multi-tasking, or data bussing in high end servers, routers or wireless local-area-networks (WLANS).

Another object of the present invention is the creation multi-angled electrical conductive and/or optical vias for improved signal routing between the chips, improved testability of the die during the process, reduction in the amount of required circuitry layers, and improvement in the reduction of stress of the integrated structure during thermal excursions and during operation of the system.

Another object of the present invention is to integrate advanced materials to achieve the electrical, mechanical, optical, and thermal properties required of this new structure including nanocomposites, mesocomposites, mesoporous materials, very high Tg (glass transition temperature) organic dielectrics, anisotropic conductive films, copperinvar-copper and other CTE controlled materials which provide low dielectric constants for high speed signal transmission and optical transmission while reducing stress in the finished system. Mesocomposites and mesoporous materials allow optical lasing, detection and wave guiding in addition to allowing formation of optical waveguides with either photo defined, laser, or soft-lithography methods. Also mesocomposites and mesoporous materials have extremely low dielectric constants, typically on the order of approximately 2.0K, which allows very fast signal transmission speeds in adjacent conductors while maintaining coefficient of thermal expansions in the same order of magnitude of semiconductor substrates (approximately 4–10 ppm/degree Centigrade). Very high Tg organic dielectrics (300 degrees Celsius) provide excellent toughness, elongation properties, and low CTE below the glass transition temperature of the material which provides an excellent dielectric material for build-up on die. Furthermore, certain polymers have excellent moisture barrier and moisture uptake properties such as Liquid Crystal Polymers (LCPs) that have excellent properties for integrating and protecting Microelectromechanical Machines (MEMs) components in the build-up process and in the final product.

Additional features and advantages of the invention will be set forth in the description which follows, and in part will be apparent from the description or may be learned by practice of the invention. The objectives and other advantages of the invention will be realized and attained by the structure particularly pointed out in the written description hereof and the appended drawings.

The embodiments of the present invention described herein make use of a stud bumping process for preparation of die interconnect pads and also two methods of dielectric application to a wafer or singular die: a) spin coating and b) press lamination. The stud bumping process has been demonstrated in die form. A typical stud bumping process machine is provided by a model 8098 Large Area Ball Bonder by Kulicke and Soffa. Stud bump wire is typically gold wire, although copper, solder, non-lead solder alloys and various other materials may be used without departing from the spirit or the scope of the invention. Spin coating and press lamination have been demonstrated for a 6" diameter wafer. Typical dielectrics for a build-up process as implemented in the present invention include nanocomposites, mesocomposites, and mesoporous materials such as those provided by SBA Materials, Inc. in Santa Barbara, Calif., also referred to as self-assembled inorganic/block-copolymer composites and mesoporous solids. Flexible Circuit materials and adhesives are preferably similar to Dupont's Pyralux system. Very High Tg organic polymers are preferably used, such as Sumitomo's PolyBenzoxazole (PBO) 8000 series, which has a Tg of approximately 300 C.; Dow Chemical's BenzoCycloButene (BCB), which has a Tg of approximately 300 C.; HD Microsystems' (Joint venture Dupont/Hitachi) Polyimide (PIQ, PIX tradenames), which has a Tg greater than 300 C.; or Brewer Science Inc.'s polyimide photoimageable dielectrics. Thermally conductive adhesives and films used herein are preferably similar to Ablefilm 561K. Epoxy coated copper as used herein is preferably similar to Oak-Mitsui Coated Copper. Anisotropic conductive films used herein are preferably of a type similar to ACF from ITO America and a product of the Sony Corporation. Embedded passive materials used herein are preferably similar to high Dk 25 micron film laminates from 3M or Oak-Mitsui. Laser Machining has been and will be utilized in this process using equipment such as, without limitation, the ESI Model 5430 UV Laser Microvia drilling machine. Solder sphere placement for interconnection has been implemented with equipment such as Shibuya's SolderBall Mounter Model SBM360. Sputtering of copper metal for interconnects has been implemented with equipment such as SFI Metal Depositor Model 8600. Microlithograph has been performed with Spectrum 3 Ultratech Steppers. Dielectric Placement has been performed with spin coaters such as Karl Suss Model ACS-200 and anisotropic film bonders similar to those distributed by Ito America. The above-referenced materials and equipment are included herein as exemplary of those used in a preferred embodiment of the present invention, and should not be interpreted as limiting the scope of the invention thereto. It should be apparent to one skilled in the art that alternative materials and equipment may be substituted therefor without departing from the spirit or the scope of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to preferred embodiments of the present invention, examples of which are illustrated in the accompanying drawings.

A build-up electrical structure that is fabricated with a build-up process and multi-angle vias for interconnecting die or multiple die and/or passive components such as capacitors, Microelectromechanical Machines (MEMs), Nanoelectromechanical Machines (MEMs), Bioelectromechanical Machines (BioMEMs), sensors, planar capacitors, resistors, planar resistors, inductors, fuel cells, antennas, thin film batteries, VCSEL's, photodiodes, or other active and passive components is described herein. Typical preferred process times and temperatures are 350° C. for one hour with normal prepregs, 250° C. for 90 seconds with mesoporous materials and 350° C. for 20 seconds for anistropic conductive adhesives. Typical process temperatures for very high Tg photo-imageable dielectrics would be 375° C. for 1 hour. Via formations are preferably made with laser milling with an ultraviolet or carbon dioxide laser, although via formations can be made using a photolithography process followed by developing and/or chemical milling, or with soft lithography. Stud Bumping preferably utilizes gold wire and is performed with a stud bumping machine such as the K&S 300 mm stud bumping machine. Chip placement is preferably performed with standard chip placement robotics with placement accuracies to 0.5 micron. The above-referenced process times, temperatures, and equipment are included herein as exemplary of those used in a preferred embodiment of the present invention, and should not be interpreted as limiting the scope of the invention thereto. It should be apparent to one skilled in the art that alternative process times, temperatures, and equipment may be substituted therefor without departing from the spirit or the scope of the invention.

Figure 1:
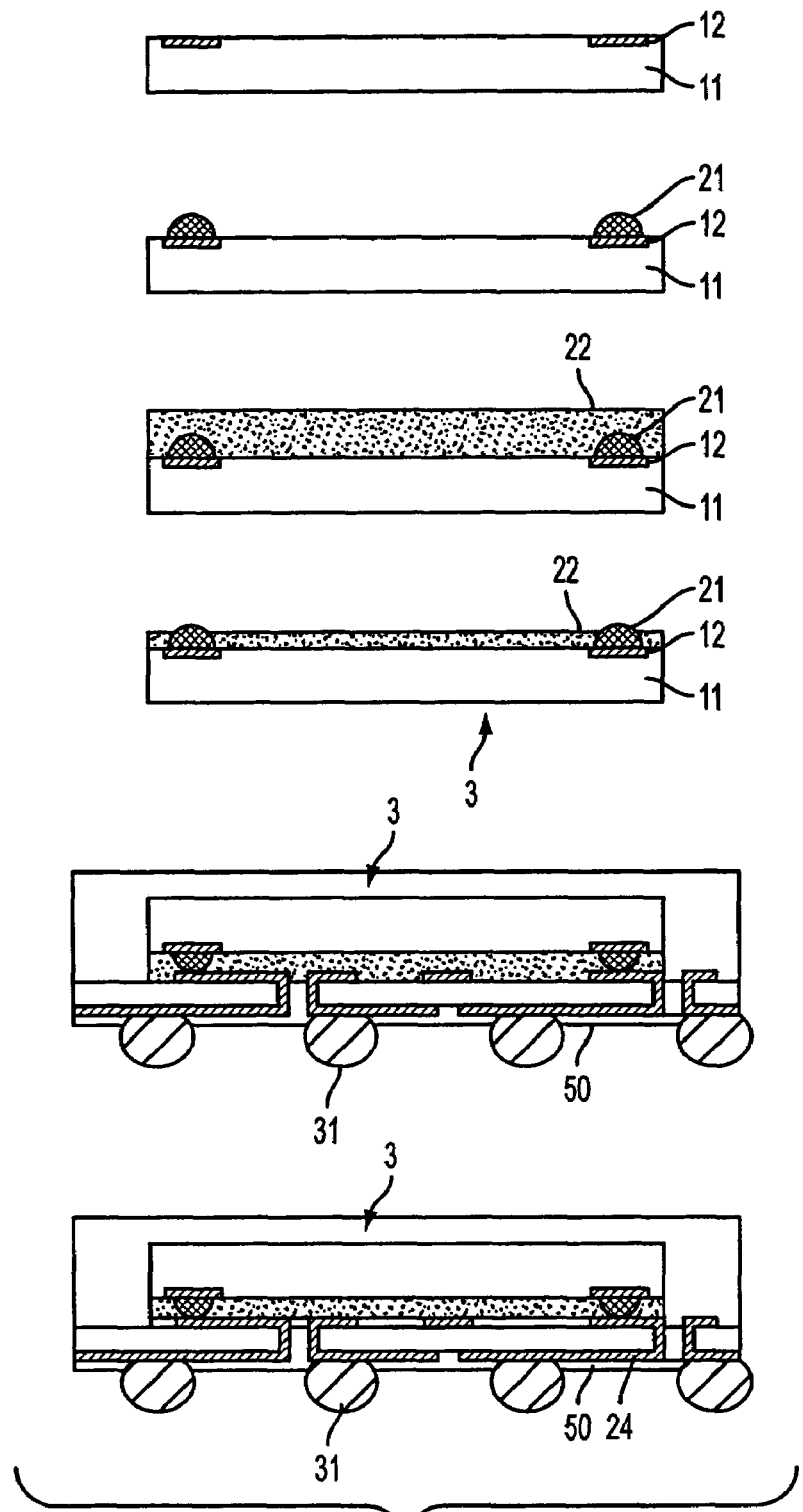
FIG. 1 a cut-away view of a prior art process through which an individual die undergoes bumping and dielectric coating, wherein the assembly is subsequently bonded to a substrate, and the conductive bumps break through an adhesive to make electrical contact to the substrate, thereby completing a chip package.
Figure 2:
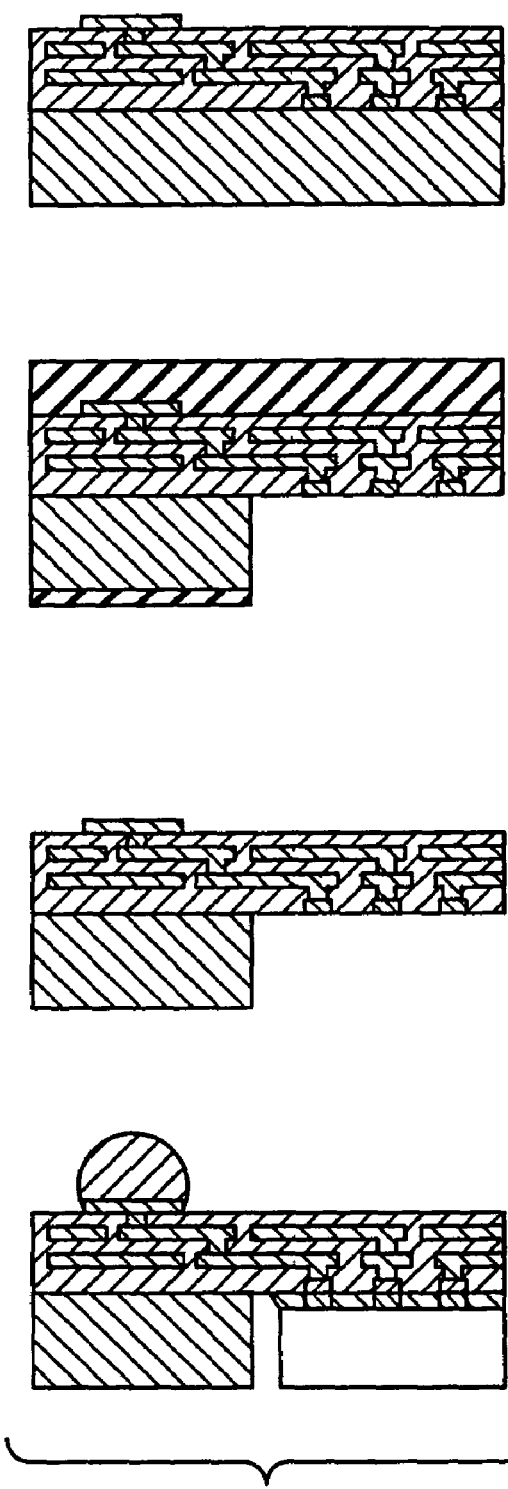
FIG. 2 is a cut-away view of a prior art process through which a multilayer package is prebuilt without a die, wherein an access port is etched in the substrate revealing the connections for the die, the die is placed in the access port, and the structure is bonded together.
Figure 3:
FIG. 3 is a cut-away view of a prior art process through which a die is positioned and bonded in an access port of a substrate, wherein the dielectric layers and via interconnects are built on top of this structure.
Figure 3:
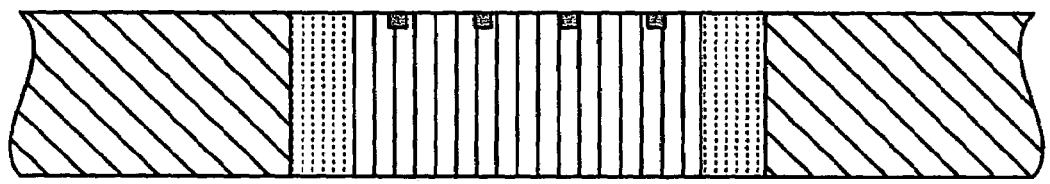
Figure 3:
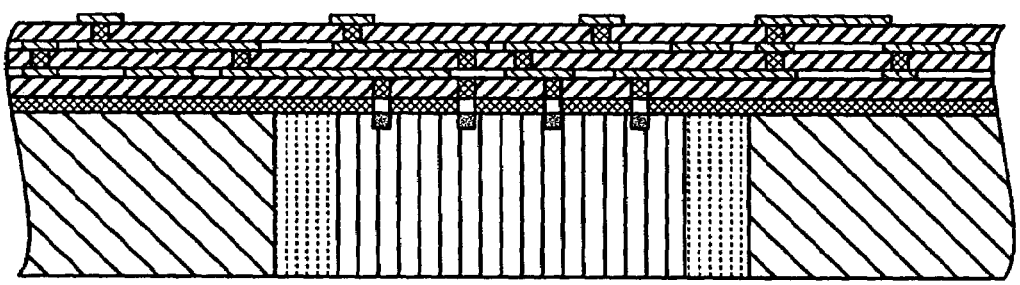
Figure 4:
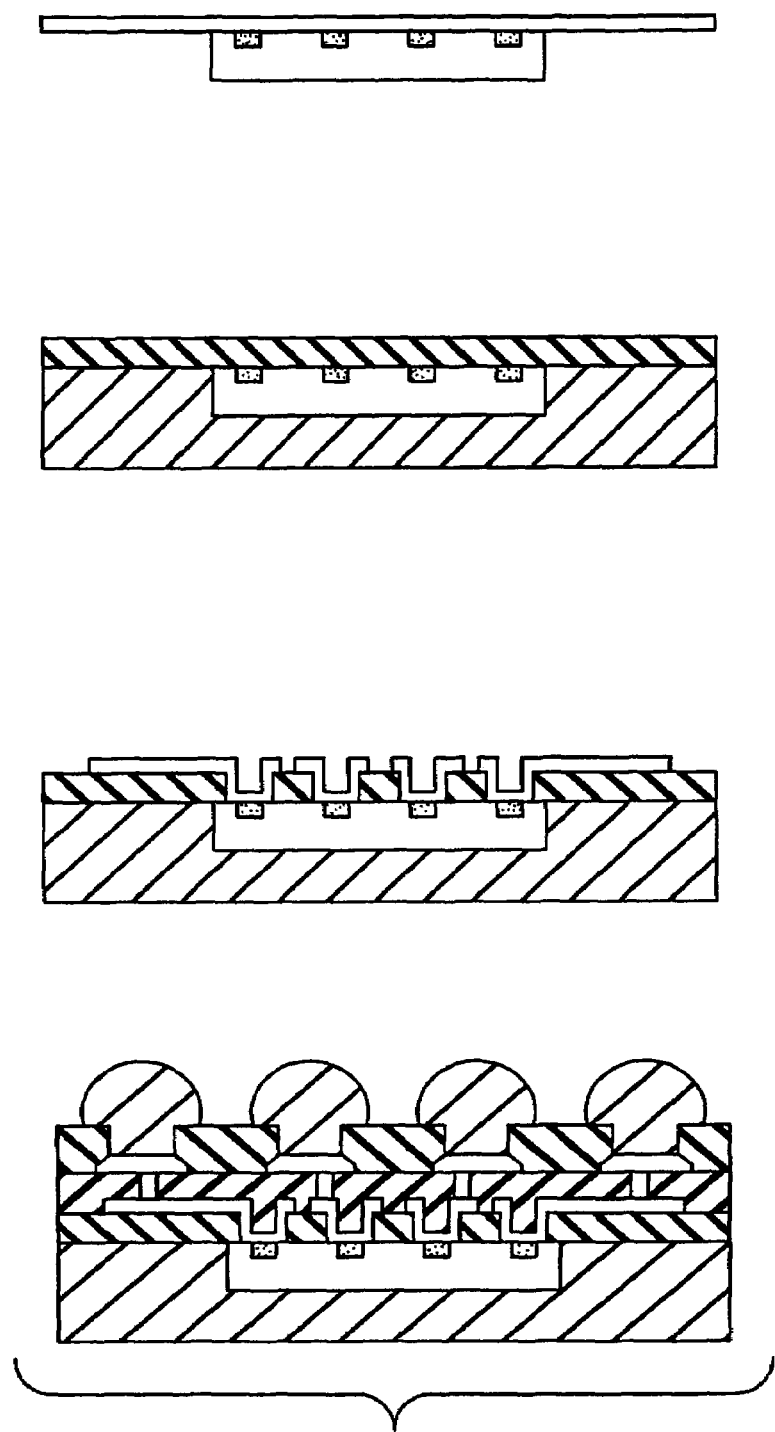
FIG. 4 is a cut-away view of a prior art build-up on die process utilizing a carrier tape to position the die, wherein the carrier tape is subsequently removed and copper/dielectrics are deposited to form individual layers in a process similar to the Intel Corporation BBUL process.
Figure 5:
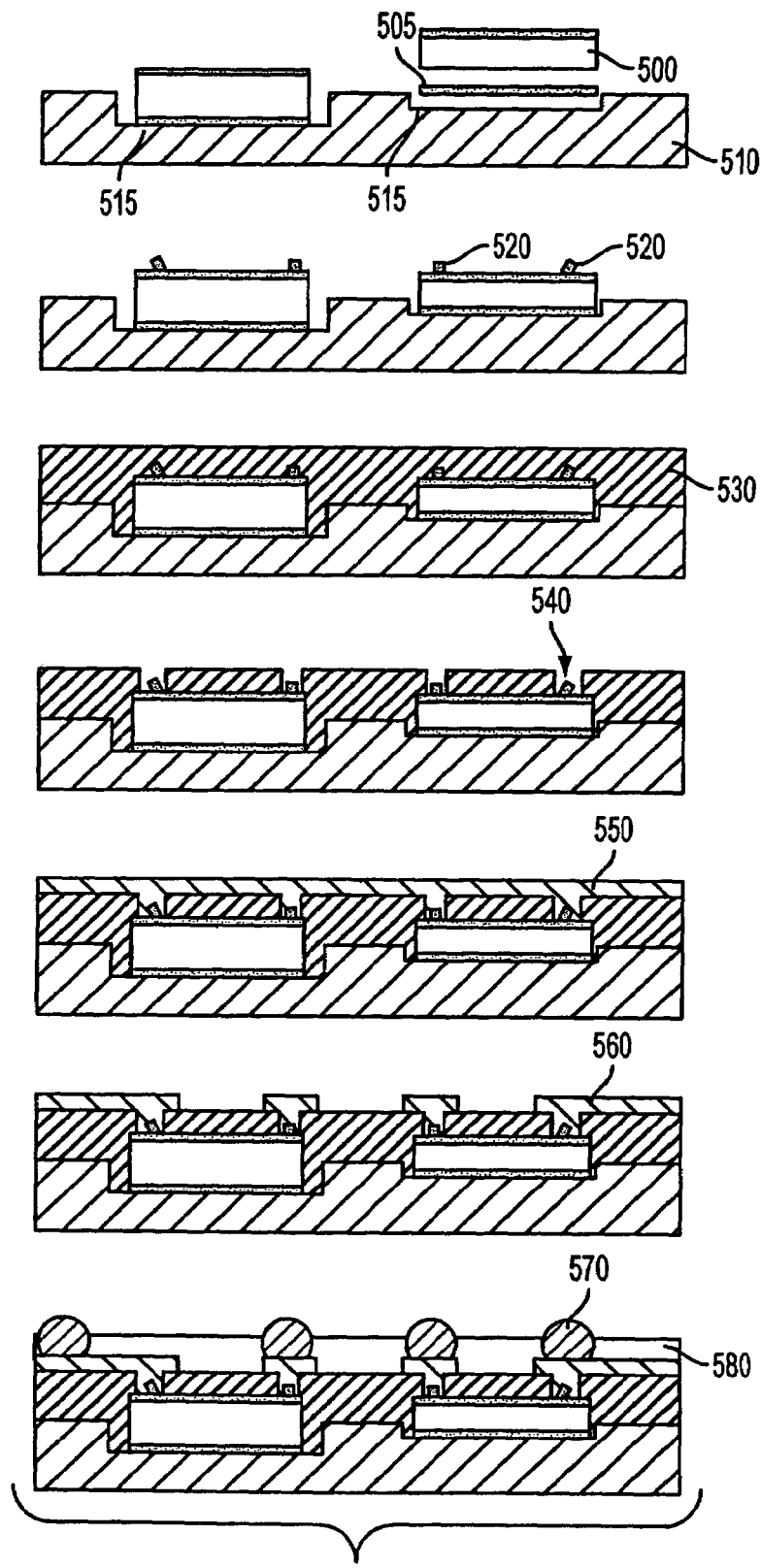
FIG. 5 is a diagram of Build-up on Die with Multi-Angle Stud Bumps and Dielectrics, wherein Vias are constructed by forming channels in a dielectric to accept conductor deposits.

FIG. 5 illustrates a build-up on die with multi-Angle Via Process and structure. Die or other active components such as MEMs 500 are tack-bonded into a multi-depth cavity 515 using a thermally conductive adhesive film 505 with a die bonding and placement machine. Multi-angle stud bumps 520 are placed on the active sites of the die and/or components in each of the active sites requiring interconnection. A controlled CTE dielectric 530, such as a mesoporous material or a very high Tg photo-imageable dielectric, is deposited over the die or multiple die utilizing a spin coating or lamination process thereby sandwiching and embedding the die. An optical waveguide is formed with the nanocomposites or nanoporous materials if required for chip to chip optical interconnects 535 and a dielectric channel 540 is formed to expose the stud bumping through soft lithography, photolithography or laser trenching. Copper plating 550 is deposited on the surface and in the channels utilizing either wet chemistry plating or sputtering. In a subsequent step, copper circuitry 560 is preferably etched in the copper plating utilizing photolithography and chemical milling, thereby forming a first circuitry (first metal) layer. Solder Mask 580 and solder balls 570 are placed on the structure surface utilizing sphere drop equipment to complete the interconnect and to allow attachment to other interconnects. The multi-depth cavities accommodate different die thicknesses and the multi-angle vias allow for escape routing from the die to other components.

Figure 6:
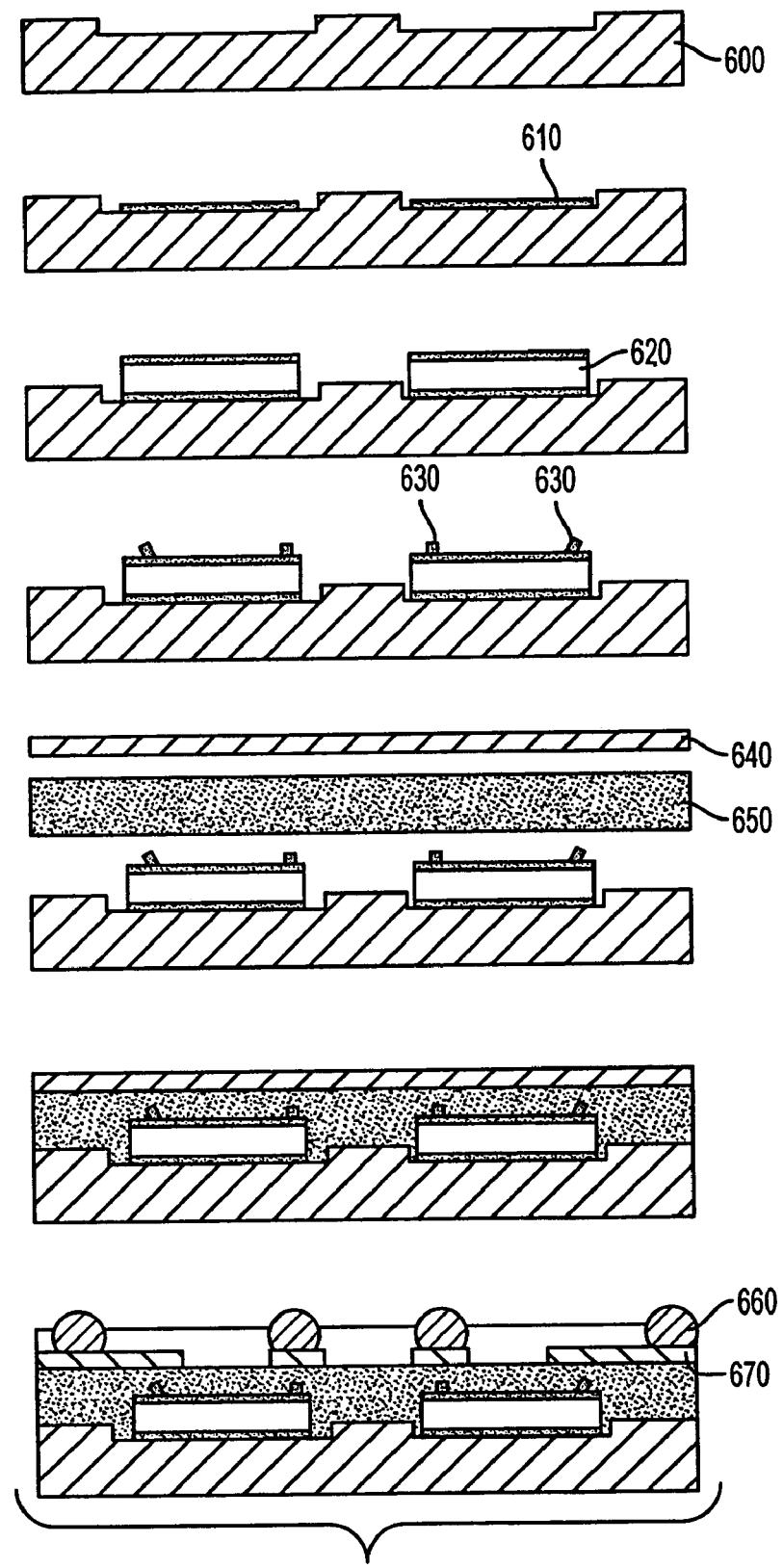
FIG. 6 is a diagram of a build-up process utilizing multi-angle stud bumps and anisotropic conductive film of a first dielectric.

FIG. 6 illustrates a Build-up process using anisotropic adhesive with multi-angle vias. In a process similar to that illustrated in FIG. 5, a thermally conductive adhesive pad 610 is placed on heatsink 600, which is preferably made of copper. Die or bare components such as MEMs 620 are accurately positioned on the thermal adhesive and the components are preferably stud bumped utilizing a stud bumping process with multi-angle vias 630. Copper foil 640 is laminated onto this structure with anisotropic conductive adhesive 650 utilizing lamination equipment, thereby embedding the die within the structure. The anisotropic adhesive allows conductivity to occur only in the vertical plane. The copper is etched into circuitry as in FIG. 5 utilizing normal printed circuit processing, such as photolithography and chemical milling. Solder balls 660 and solder mask 670 are placed on the circuitry utilizing sphere drop equipment and solder mask screening process equipment to complete the structure where connection between the multiangle vias and the copper circuitry is performed by the anisotropic conductive adhesive.

Figure 7:
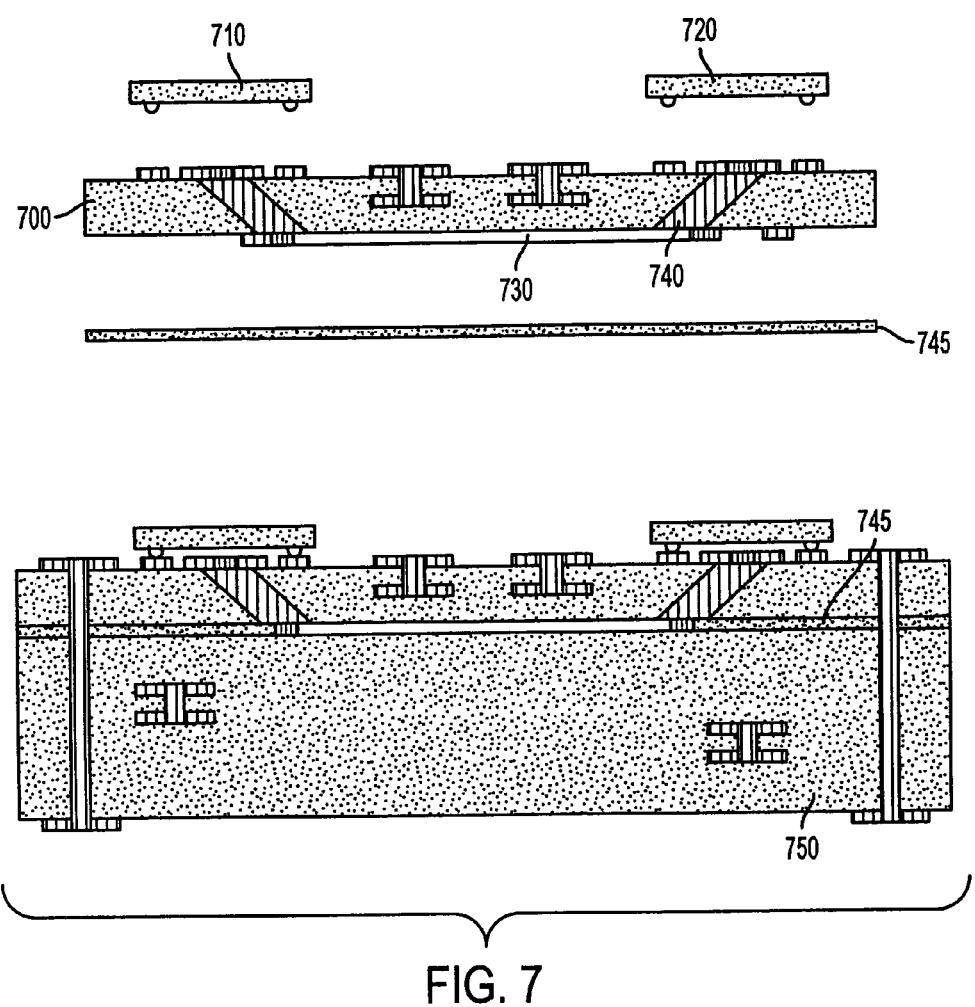
FIG. 7 is a diagram of a build-up process utilizing multi-angle optical vias which accept surface mount optical components.

FIG. 7 illustrates another embodiment of the present invention. In this embodiment, a flex circuit substructure 700, with multi-angle vias 740, is fabricated with an optical waveguide of mesocomposite material 730 applied to the bottom side of the flex circuit substructure and positioned between the optical vias of the substructure. The multiangle vias allow light to transmit by reflection through the optical via. This structure forms an optical pathway from a VCSEL laser light source 710 on the surface to a photodiode 720, also on the surface with the light pathway following the multi-angle vias on either side of the optical waveguide. This flex circuit is then attached to a backplane multilayer 750 utilizing an adhesive film 745 with a lamination process and a plated-through hole process, thereby completing the optical and electrical interconnect.

Figure 8:
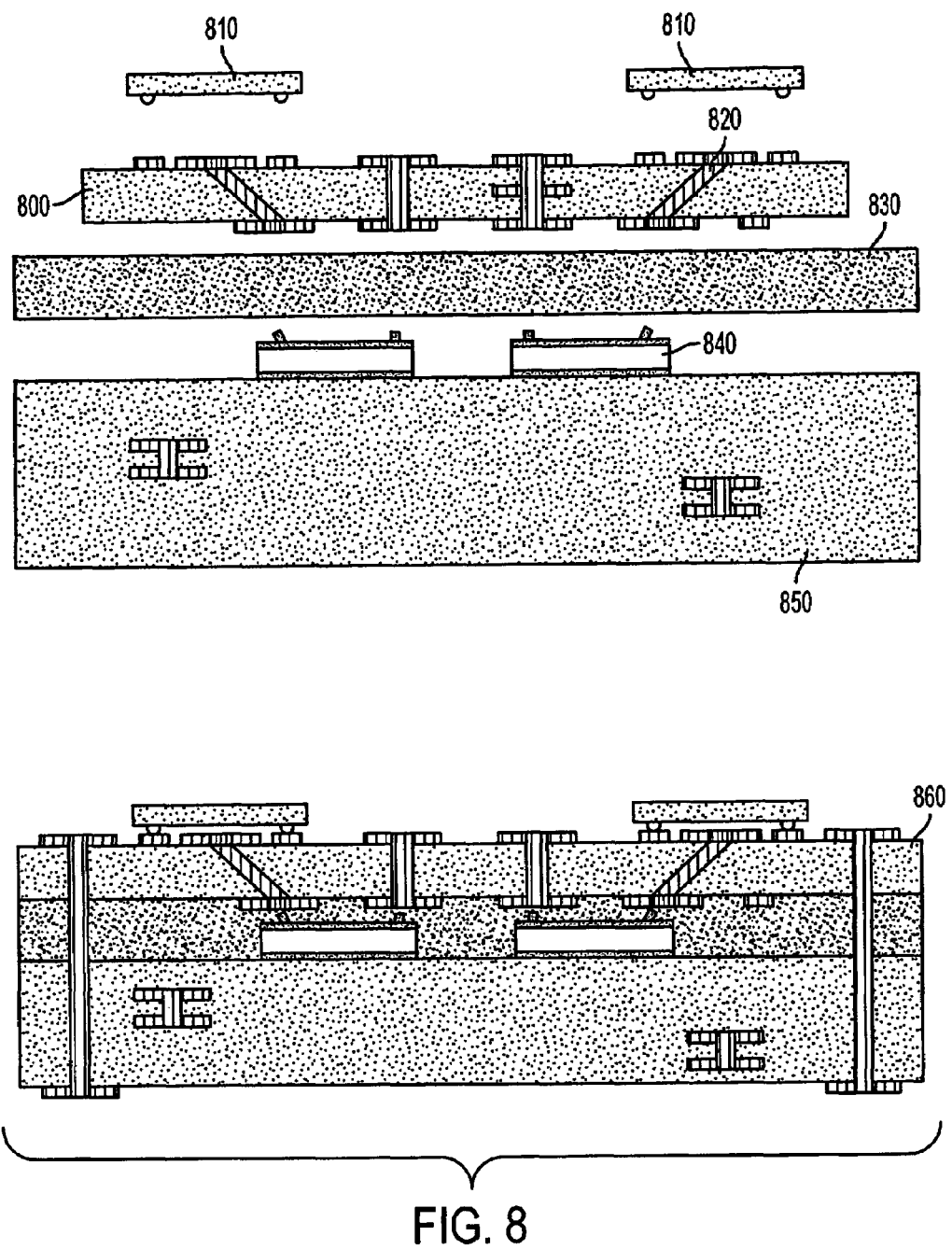
FIG. 8 is a diagram of a build-up process utilizing multi-angle plated-through hole vias and anisotropic conductive adhesive to interconnect embedded die in a multilayer structure.

FIG. 8 illustrates an electrical version of FIG. 7 with embedded die. A flex circuit 800 with multi-angle electrical vias 820 is laminated to a multilayer substrate 850 with anisotropic conductive adhesive 830. A completed multilayer substrate 860 is produced by finishing the structure with a standard printed circuit process to achieve platedthrough holes. Electrical interconnection between components and die is accomplished through the anisotropic conductive adhesive and the multi-angle stud bumping and electrical vias.

Figure 9:
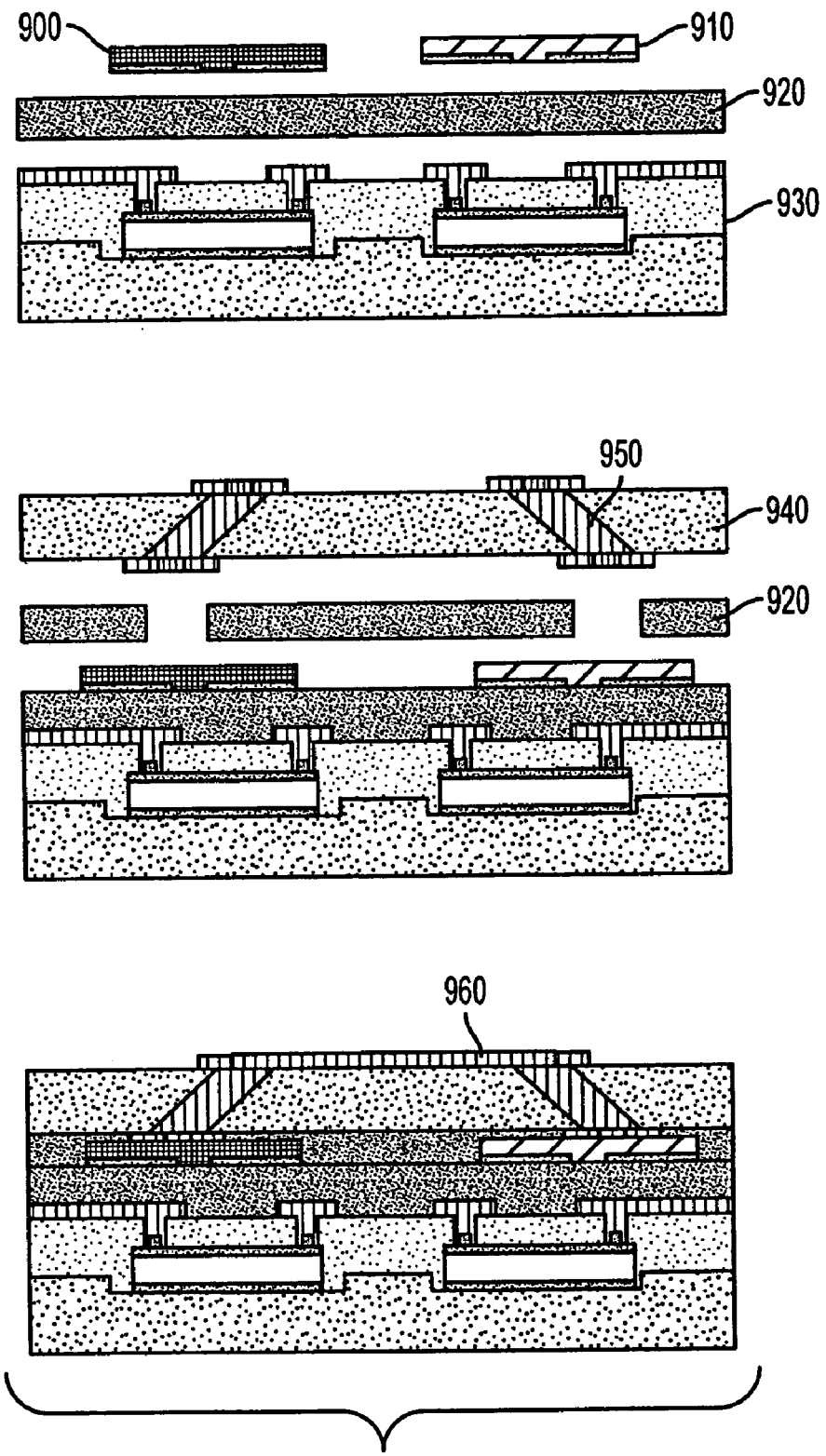
FIG. 9 is an optical interconnect build-up structure utilizing embedded VCSEL's multi-angle vias and mesoporous waveguides.

FIG. 9 is another embodiment of the present invention. In this embodiment, active optical components, including VSCEL 900 and Photodiode 910, are tack bonded with a short time and temperature anisotropic conductive adhesive to a build-up on die composite 930. Subsequently, a two-sided microflex with multi-angle vias 940 is laminated to the structure utilizing a second ply of anistropic adhesive 920. After lamination a mesoporous or mesocomposite waveguide 960 is formed between the multi-angle optical vias to form a complete chip to chip light path through the optical vias and the optical waveguide.

Figure 10:
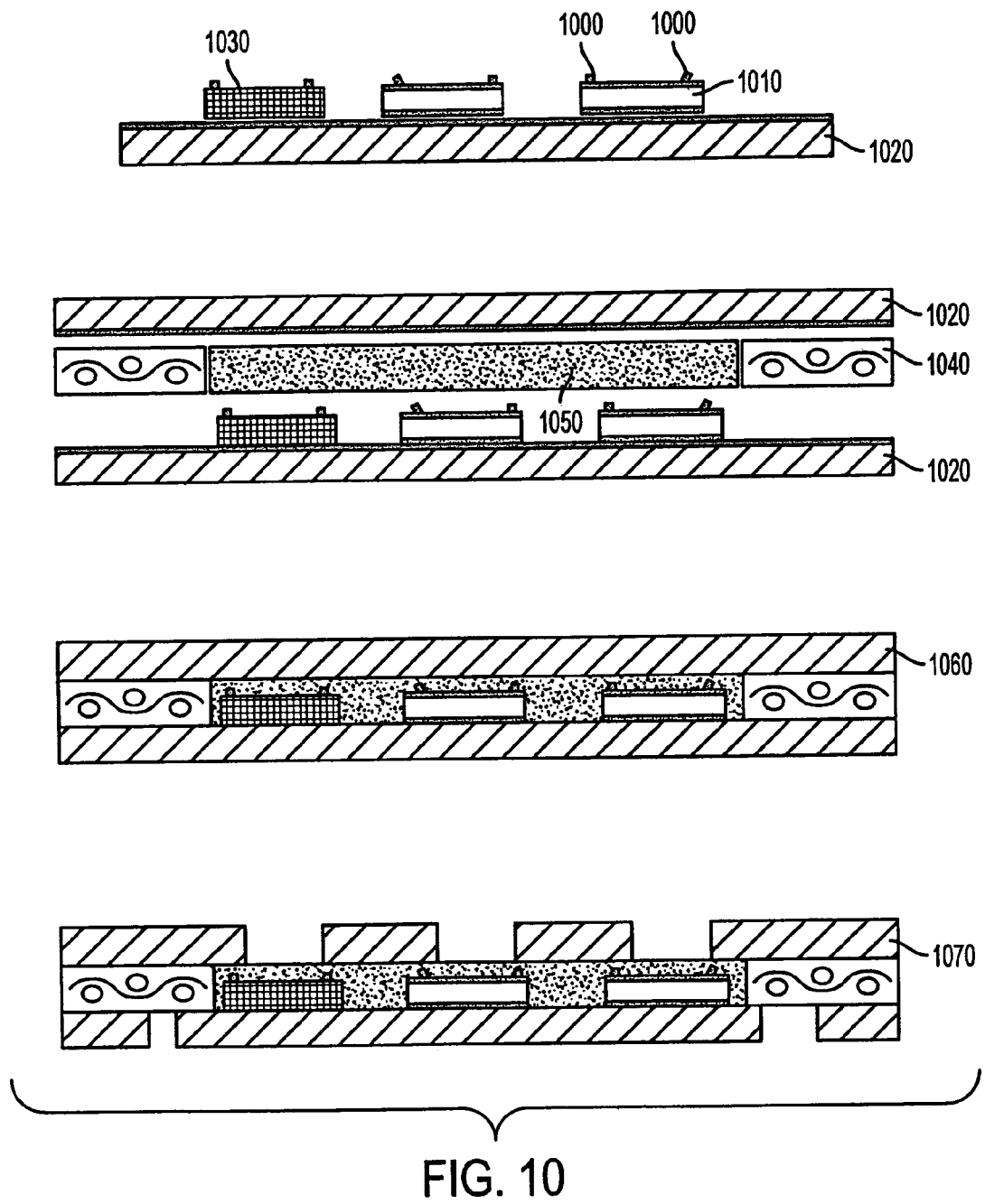
FIG. 10 is a metal core laminate with embedded die and passive components utilizing anisotropic adhesive and multi-angle stud bumps.

FIG. 10 is a preferred embodiment of the present invention in which a copper clad laminate structure is constructed with a build-up process and incorporates embedded die and active/passive components in the copper clad laminate. This structure can later be relaminated into another multilayer structure or printed circuit. Die 1010 and passive component or MEMs device 1030 with multi-angle stud bumps are accurately placed and tack bonded on epoxy coated copper foil 1020. Composite 1060 is formed utilizing a combination of prepreg 1040, anisotropic conductive adhesive 1050 and epoxy coated copper foil 1020. Subsequently, composite 1060 is etched with a normal printed circuit process to form an inner circuit layer for a multilayer system 1070 with embedded components.

Figure 11:
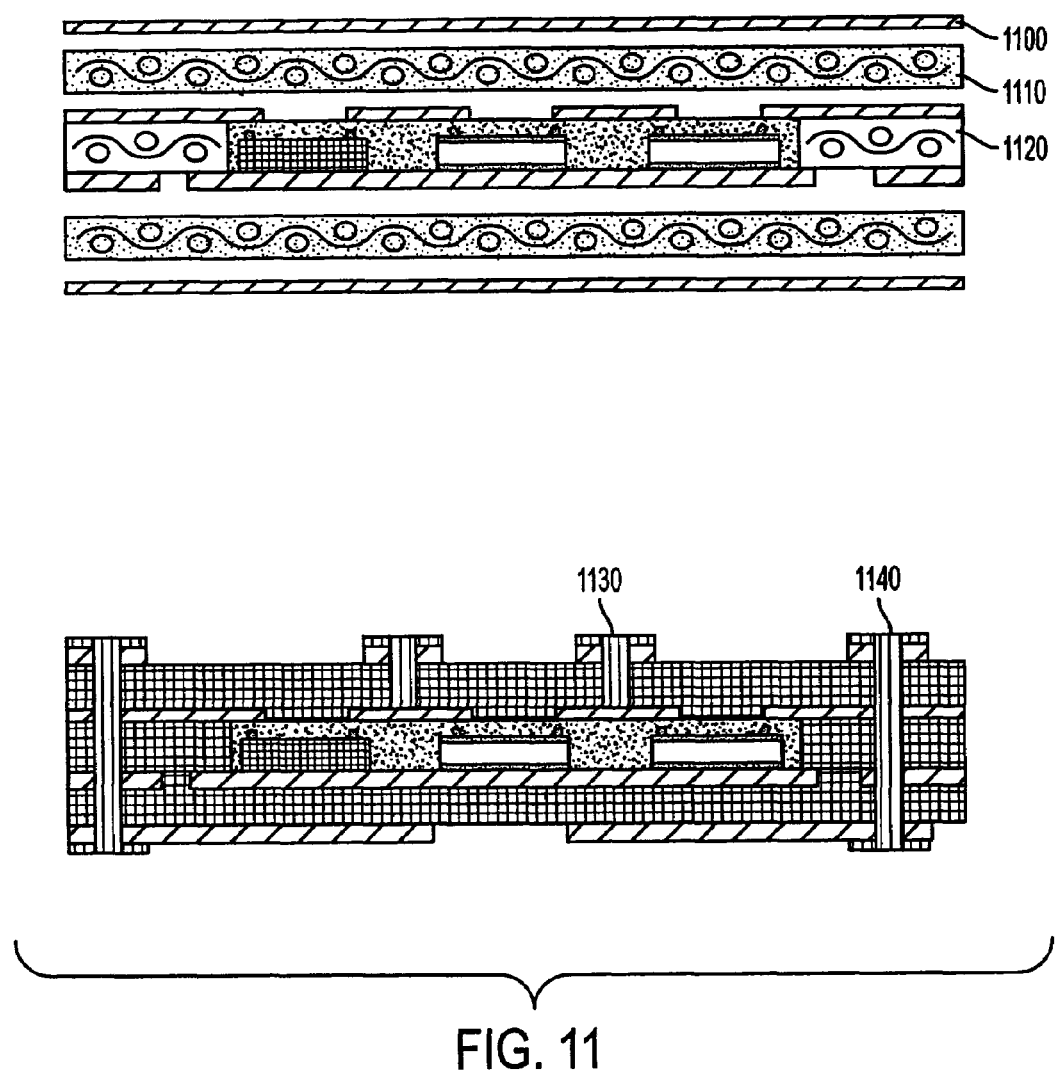
FIG. 11 is a multilayer printed circuit board utilizing a copper clad laminate with embedded components from FIG. 10.

FIG. 11 illustrates a multilayer printed circuit and interconnect utilizing the multilayer core from FIG. 10 with embedded die and/or components. The inner core layer 1120 is laminated with prepreg adhesive 1110 and copper foil 1100 in a lamination press. The structure is then processed with normal printed circuit processing to form blind vias 1130 and through hole vias 1140.

Figure 12:
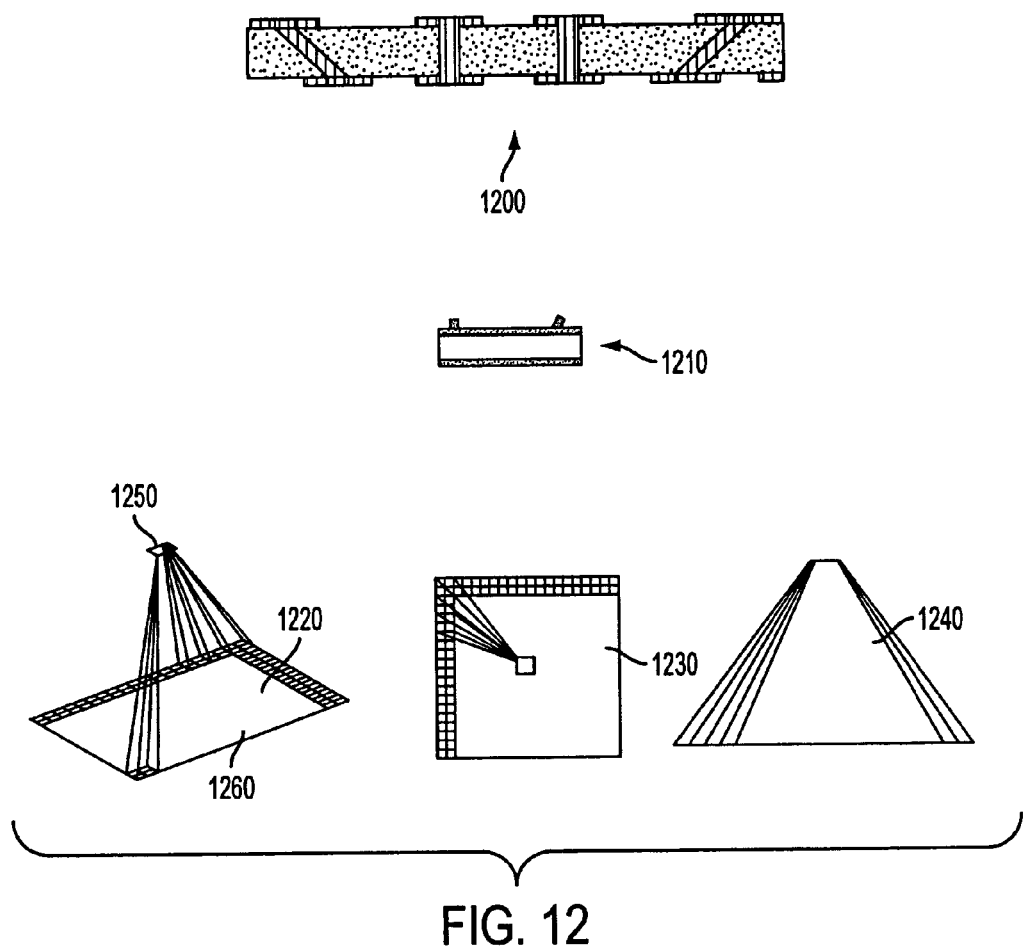
FIG. 12 illustrates preferred Escape Design geometries for Optical and Electrical multi-Angle Vias and Stud Bumping.

FIG. 12 illustrates preferred geometries for multi-angle vias 1200 and for stud bumps 1210. Preferred geometrical relationships between two different planes and their respective pitches are shown in ISO view 1220, top view 1230 and side view 1240. The two pitch planes represent the tighter semiconductor die pitch plane 1250 and a wider pitch plane 1260 typical of printed circuits. These relationships can be used to determine the correct via angle, either electrically or optically, and the subsequent thickness necessary to achieve the angle for escape routing between the different planes of reference.

Figure 13:
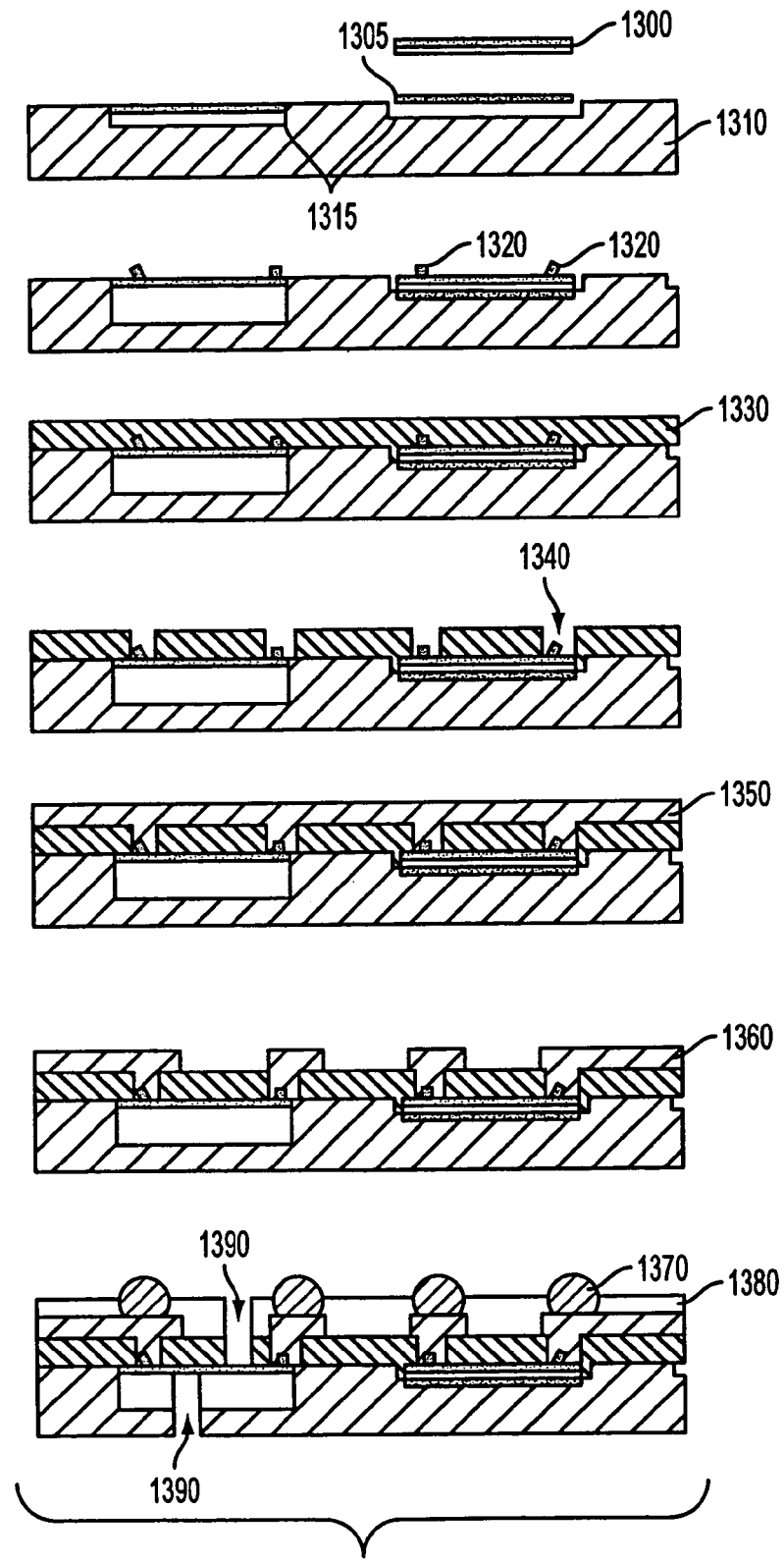
FIG. 13 illustrates Wafer Scale Build-up MEMs package with die attach.

FIG. 13 illustrates a build-up on wafer with a multi-Angle Via Process and structure. Die or other active components 1300 are preferably tack-bonded into a multi-depth cavity 1315 using a thermally conductive adhesive film 1305 with a die bonding and placement machine. Multi-angle stud bumps 1320 are preferably placed on the active sites of the die and on the active MEMs devices which are integral to the wafer substrate 1310. An alternative to the stud-bumping is apply standard under bump metallization (UBM) as an interconnect interface. A controlled CTE dielectric 1330, such as a mesoporous material or a very high Tg photo-imageable dielectric, is deposited over the wafer substrate utilizing a spin coating or lamination process thereby sandwiching and embedding the die. A dielectric channel 1340 is formed to expose the stud bumping through soft lithography, photolithography or laser trenching. Copper plating 1350 is deposited on the surface and in the channels utilizing either wet chemistry plating or sputtering. In a subsequent step, copper circuitry 1360 is preferably etched in the copper plating utilizing photolithography and chemical milling, thereby forming a first circuitry (first metal) layer. Solder Mask 1380 and solder balls 1370 are preferably placed on the structure surface utilizing sphere drop equipment to complete the interconnect and to allow attachment to other interconnects. Aperture Vias 1390 are preferably formed through either the wafer substrate or through the top dielectrics by laser micromachining, chemical etching or through reactive ion etching to expose the active Microelectromechanical Machine (MEMs) active surfaces. The multi-depth cavities can accommodate different die thicknesses and the multi-angle vias allow for escape routing from the die to other components.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

I claim:

1. A build up on die method utilizing multi-angle vias, the multi-angle vias being oriented at 1 degree to 179 degree in reference to the plane of the die, the method comprising:
   receiving a substrate material, the substrate material comprised of a plurality of cavities;
   tack-bonding at least one component into at least one cavity;
   placing at least one via on an active site of the at least one component;
   depositing a dielectric over at least the at least one component and the at least one via to form a dielectric layer;
   forming at least one channel in the dielectric layer to expose the at least one via;
   depositing a conductive surface over the dielectric layer and the exposed at least one via to form a conductive layer;
   etching the conductive layer to form a first circuitry layer;
   placing a least one solder bump on the first circuitry layer, the at least one solder bump having a known average height, wherein each solder bump is positioned substantially above each of the at least one vias; and,
   placing solder mask over the first circuitry layer, wherein the solder mask depth is less than the known average solder bump height.

2. The method of claim 1, wherein the tack-bonding is performed using a thermally conductive adhesive film.

3. The method of claim 2, wherein the at least one component is tack-bonded using a die bonding and placement machine.

4. The method of claim 1, wherein the dielectric is a mesoporous material.

5. The method of claim 1, wherein the dielectric is a very high Tg photo-imageable dielectric.

6. The method of claim 1, wherein the dielectric is deposited utilizing a spin coating process.

7. The method of claim 1, wherein the dielectric is deposited utilizing a lamination process.

8. The method of claim 1, further comprising forming at least one optical waveguide in the dielectric.

9. The method of claim 1, wherein the conductive surface is copper.

10. The method of claim 1, wherein the conductive surface is deposited by sputtering.

11. The method of claim 1, wherein the conductive surface is deposited using a wet chemistry plating technique.

12. The method of claim 1, wherein the etching is performed by photolithography and chemical milling.

13. The method of claim 1, wherein the plurality of solder balls are placed utilizing sphere drop equipment.

14. The method of claim 13, further comprising employing a standard solder reflow process to adhere the at least one solder bump to the underlying surface.

15. The method of claim 1, wherein the substrate material includes one or more embedded die.

16. The method of claim 15, wherein and the at least one vias are formed to connect with the active sites on the one or more embedded die.

17. The method of claim 16, where the vias are perpendicular to the plane of the embedded die.

18. The method of claim 1, wherein at least two of the plurality of cavities are at different depths.

* * * * *